US008638825B2

(12) United States Patent
Kaneko (10) Patent No.: US 8,638,825 B2
(45) Date of Patent: Jan. 28, 2014

(54) WAVELENGTH TUNABLE LASER DIODE

(75) Inventor: Toshimitsu Kaneko, Yokohama (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 0 days.

(21) Appl. No.: 13/534,045

(22) Filed: Jun. 27, 2012

(65) Prior Publication Data

US 2013/0003762 A1 Jan. 3, 2013

(30) Foreign Application Priority Data

Jun. 29, 2011 (JP) ................................ 2011-144569
Sep. 12, 2011 (JP) ................................ 2011-198389

(51) Int. Cl.
*H01S 3/10* (2006.01)

(52) U.S. Cl.
USPC ...... 372/20; 372/50.11; 372/50.22; 372/50.1; 372/102

(58) Field of Classification Search
USPC ..................... 372/20, 50.11, 50.22, 50.1, 102
See application file for complete search history.

(56) References Cited

U.S. PATENT DOCUMENTS

2003/0086655 A1* 5/2003 Deacon ........................... 385/50
2007/0036188 A1 2/2007 Fujii
2008/0247707 A1* 10/2008 Fujii ............................... 385/14

FOREIGN PATENT DOCUMENTS

JP 2007-48988 2/2007

* cited by examiner

*Primary Examiner* — Kinam Park
(74) *Attorney, Agent, or Firm* — Smith, Gambrell & Russell, LLP (57) ABSTRACT

A wavelength tunable laser diode (LD) is disclosed. The LD provides a SG-DFB region and a CSG-DBR region. The SG-DFB region shows a gain spectrum with a plurality of gain peaks, while, the CSG-DBR region shows a reflection spectrum with a plurality of reflection peaks. The LD may emit light with a wavelength at which the one of the gain peaks and one of the reflection peaks coincides. In the present LD, both the gain spectrum and the reflection spectrum are modified by adjusting the temperature of the SG-DFB region and that of the CSG-DBR region independently.

19 Claims, 7 Drawing Sheets

WAVELENGTH TUNABLE LASER DIODE

BACKGROUND OF THE INVENTION

1. Field of the Invention

The present invention relates to a semiconductor laser diode (hereafter denoted as LD), and a module implementing the LD.

2. Related Background Arts

One type of LDs has been known as a wavelength tunable LD, where the LD includes a chirped-sampled-grating (hereafter denoted as CSG) distributed Bragg reflector (hereafter denoted as DBR) whose reflection spectrum includes a plurality of peaks with a specific period, and a sampled-grating (hereafter denoted as SG) distributed feedback (hereafter denoted as DFB) whose gain spectrum includes a plurality of peaks with another specific period. Such an LD may emit light with a wavelength at which one of the reflection peaks in the CSG-DBR and one of the gain peaks in the SG-DFB coincide.

SUMMARY OF THE INVENTION

An aspect of the present invention relates to a wavelength tunable LD that comprises an optical waveguide and a reflector. The optical waveguide includes a plurality of gain regions and a plurality of modifying regions alternately arranged to each other along the optical axis of the waveguide. The optical waveguide shows a wavelength spectrum including a plurality of gain peaks. Each of the modifying regions provides a heater to shift the gain peaks. The reflector, which may be optically coupled with the waveguide, shows a wavelength spectrum including a plurality of reflection peaks. A feature of the LD according to an embodiment is that the LD may emit light with a wavelength at which one of the gain peaks attributed to the optical waveguide and one of the reflection peaks attributed to the reflector coincides.

In another aspect of the LD of the embodiment, the LD comprises a sampled-grating distributed feedback (SG-DFB) region and a chirped-sampled-grating Bragg reflector (CSG-DBR) region. The SG-DFB region and the CSG-DBR region commonly provide a semiconductor substrate, a lower cladding layer disposed on the semiconductor substrate, and an upper cladding layer.

The SG-DFB region may provides, on the lower cladding and beneath the upper cladding layer, a plurality of gain regions and modifying regions alternately arranged along the optical axis of the LD. The gain regions and the modifying regions constitute the optical waveguide in the SG-DFB region.

The CSG-DBR region provides an optical waveguide put between the lower cladding layer and the upper cladding layer and a plurality of grating regions in the lower cladding layer, and optically coupled with the optical waveguide of the SG-DBR region. The grating region and a space region formed between the grating regions neighbor to each other constituting a segment, the space region providing a heater to modify an optical length of the segment.

A feature of the LD is that the SG-DFB region shows a plurality of gain peaks whose wavelength is adjusted by the heater provided in the modifying region; while, the CSG-DBR region shows a plurality of reflection peaks whose wavelength is adjusted by the heater provided in the space region. The LD of the embodiment may emit light at a wavelength where one of gain peaks and one of reflection peaks coincide.

BRIEF DESCRIPTION OF THE DRAWINGS

The foregoing and other purposes, aspects and advantages will be better understood from the following detailed description of a preferred embodiment of the invention with reference to the drawings, in which:

FIG. 2A copies FIG. 1A.

DESCRIPTION OF PREFERRED EMBODIMENTS

Next, some preferable embodiments according to the present invention will be described as referring to the drawings. In the description of the drawings, the numerals or symbols same or similar to each other will refer to the elements same or similar to each other without overlapping explanations.

First Embodiment

Figure 1A:
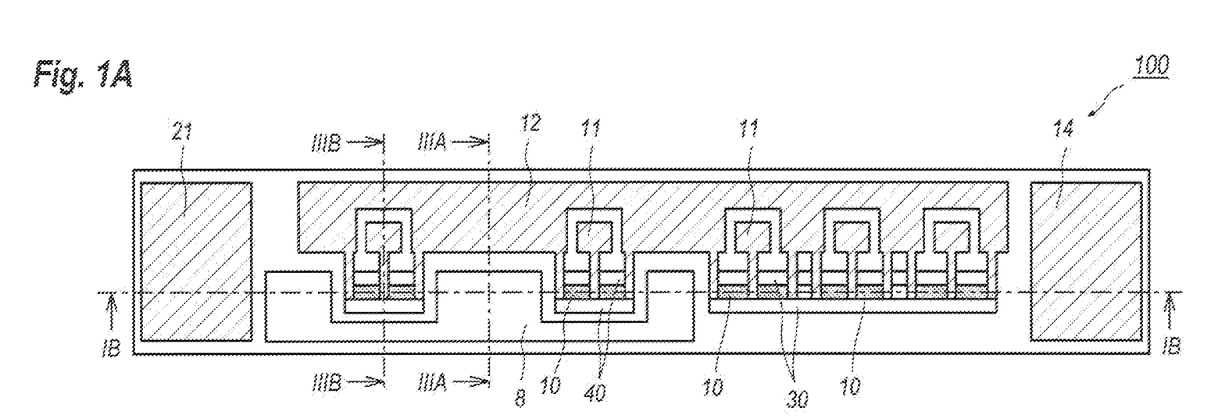
FIG. 1A is a plan view of a tunable LD according to an embodiment of the invention.
Figure 1B:
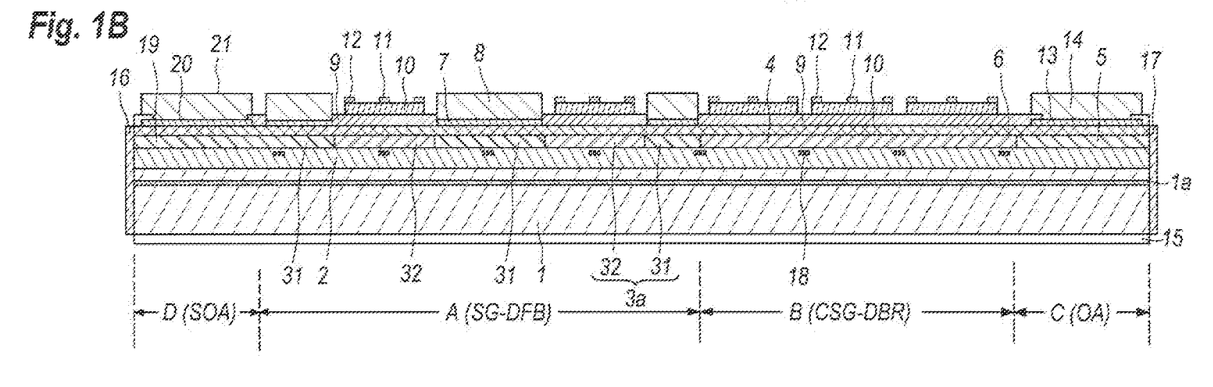
FIG. 1B is a cross section of the LD taken along the line IB-IB indicated in FIG. 1A.
Figure 2A:
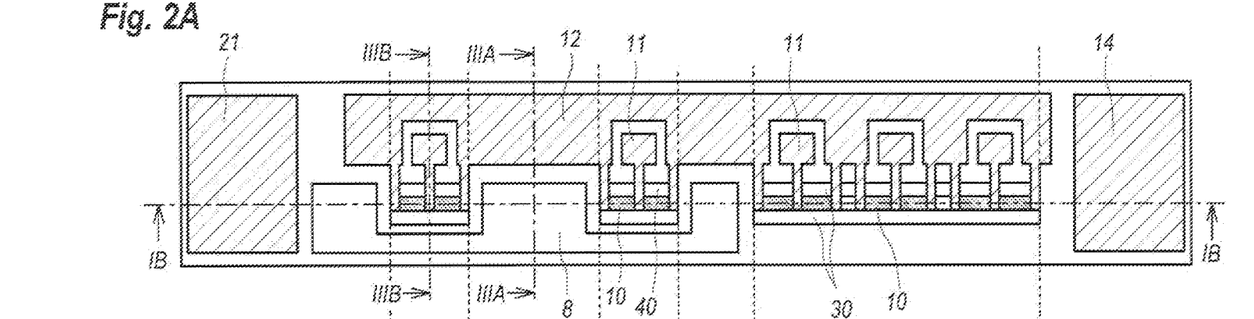
Figure 2B:
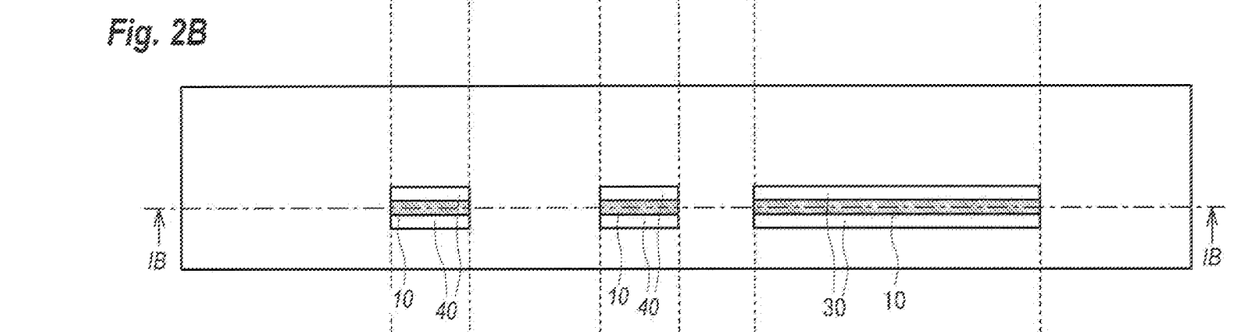
FIG. 2B is also a plan view of the LD but omits electrodes.
Figure 3A:
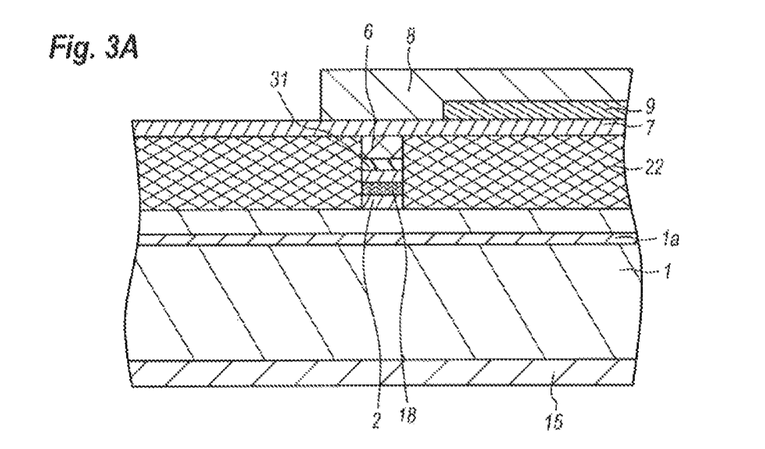
FIG. 3A shows a cross section taken along the line IIIA-IIIA indicated in FIG. 1A.
Figure 3B:
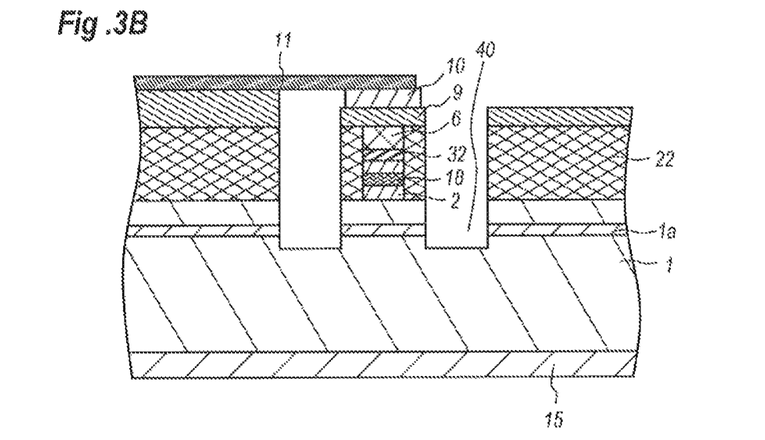
FIG. 3B is also a cross section taken along the line IIIB-IIIB indicated in FIG. 1A.

FIG. 1A is a plan view of a wavelength tunable LD 100 according to the first embodiment of the invention; FIG. 1B shows a cross section taken along the line IB-IB indicated in FIG. 1A; FIG. 2A copies FIG. 1A; FIG. 2B is also a plan view of the LD 100 but FIG. 2B omits electrodes, FIG. 3A shows a cross section taken along the line IIIA-IIIA indicated in FIG. 1A; and FIG. 3B is also a cross section taken along the line IIIB-IIIB indicated in FIG. 1A.

The LD 100 of the embodiment includes a semiconductor optical amplifier (hereafter denoted as SOA) region D, an SG-DFB region A, a CSG-DBR region B, and an optical absorption (hereafter denoted as OA) region C, where each regions are arranged in series in this order. The SG-DFB region A includes a lower cladding layer 2, an active layer 3, and an upper cladding layer 6, where they are stacked on a semiconductor substrate 1 in this order. The SG-DFB region A further includes, on the upper cladding layer 6, a contact layer 7 and electrodes 8. The CSG-DBR region B includes the lower cladding layer 2, a waveguide layer 4 and the upper cladding layer 6, where they are stacked on the substrate 1 in this order. The CSG-DBR region B further includes a plurality of heaters 10 on the upper cladding layer 6 via an insulating layer 9. Each of heaters 10 accompanies with a supply electrode 11 and a ground electrode 12. The OA region C includes, on the substrate 1, the lower cladding layer 2, an absorption layer 5, and the upper cladding layer 6. The OA region C further includes the contact layer 13 and electrodes 14 on the upper cladding layer 6. The SOA region D includes, on the substrate 1, the lower cladding layer 2, an amplifying layer 19, and the upper cladding layer 6. The SOA region D further includes a contact layer 20 and electrodes 21.

Thus, regions A to D are integrally formed on the substrate 1 common to all regions, A to D. The active layer 3 in the SG-DFB region A, the waveguide layer 4 in the CSG-DBR region B, the optical absorption layer 5 in the OA region C, and the amplifying layer 19 in the SOA region D are optically coupled with each other. An end facet of the SOA region D provides an anti-reflection (AR) coating 16; while, one end of the OA region C provides a high-reflection (HR) coating 17. The substrate 1 provides, in a back surface thereof, an electrode extending in all regions, A to D.

The lower cladding layer 2 in the SG-DFB region A and that in the CSG-DBR region B have a plurality of grating regions 18. Each of the grating regions 18 includes a plurality of optical gratings arranged with a space therebetween. Each of optical gratings includes corrugations formed in the interface between the lower cladding layer 2 and a material on the lower cladding layer 2. The material has refractive index different from that of the lower cladding layer 2. Thus, the grating regions 18 with the space therebetween constitute the sampled grating.

Each of the SG-DFB region A and the CSG-DBR region B is comprised of a plurality of segments each including one grating region 18 and one space region put between the grating regions 18. A plurality of segments collectively operates as a reflector. Moreover, the optical length of respective segments in the SG-DFB region A are set to be equal to the others; while, the optical length of at least one segment in the CSG-DBR region B is different from that of other segments in the CSG-DBR region B. Thus, the CSG-DBR region B includes a plurality of types of sampled gratings each having a specific optical length.

The SG-DFB region A thus configured inherently has a gain spectrum with a plurality of peaks against the wavelength; while, the CSG-DBR region B thus configured shows a reflection spectrum with a plurality of peaks. In particular, because the CSG-DBR region B has a plurality of sampled gratins, an envelope of reflection peaks shows a dependence of the wavelength.

The LD 100 shows a lowest threshold at a wavelength where one of gain peaks of the SG-DFB region A coincides with one of reflection peaks of the CSG-DBR region B; then the LD 100 may emit light with this wavelength. The LD 100 is designed such that a distance to the nearest gain peak in the SG-DFB region A is slightly different from a distance to the nearest reflection peak in the CSG-DBR region B. Accordingly, varying the refractive index of the CSG-DBR region B, the distance to the nearest reflection peak may be varied, and the wavelength at which the LD 100 emits light may be tunable in a wide range by using, what is called, the vernier effect.

As already described, the SG-DFB region A operates as the gain region. As shown in FIG. 1B, the SG-DFB region A includes, on a semiconductor substrate 1, a lower cladding layer 2, a waveguide layer 3a, an upper cladding layer 6. The waveguide layer 3a includes a plurality of gain regions 31 and modifying regions 32 alternately arranged along the optical axis of the LD 100, where the modifying region 32 may modify the refractive index thereof. In the simplest arrangement, one modifying region 32 is arranged between two gain regions 31.

One gain region 31 is arranged closest to the CSG-DBR region B. This particular gain region 31 extends from a center of the grating region 18 provided in the interface between the SG-DFB region A and the CSG-DBR region B toward the next grating regions 18 in the SG-DFB region A. The modifying region 32 next to this particular gain region 31 extends from this portion between the grating regions 18 to the next portion between the grating regions 18. Further, the gain region 31 next to this modifying region 32 extends from this portion to the next portion between the grating regions 18. Thus, the gain regions 31 and the modifying regions 32 except for the particular gain region closest to the CSG-DBR region B are alternately arranged to correspond to respective grating region 18. In other words, the gain regions 31 and the modifying regions 32 are alternately arranged along the optical axis so as to involve one grating region 18.

The gain regions 31 stacks a contact layer 7 and an electrode 8 in this order on the upper cladding layer 6; while, the modifying region 32 stacks an insulating film 9 and a heater in this order on the upper cladding layer 6. As shown in FIGS. 1A and 2B, the CSG-DBR region B forms a striped mesa put between grooves 30 along the optical axis. FIG. 2B shows the grooves 30 in both sides of the heater 10. Also, the modifying regions 32 in the SG-DFB region A provides a striped mesa put between grooves 40 extending along the optical axis thereof. FIG. 2B shows the grooves 40 in both sides of the heater 10 in the SG-DFB region A. The supply electrode 11 and the ground electrode 12 are connected to the heater 10 as crossing the grooves, 30 and 40, by an air-bridge structure.

As shown in figures, four regions, A to D, of the SG-DFB region A, the CSG-DBR region B, the OA region C, and the SOA region D are integrally arranged on the substrate 1 common to respective regions, A to D. Moreover, the waveguide layer 3a in the SG-DFB region A, the other waveguide layer 4 in the CSG-DBR region B, the absorption layer 5 in the SO region C, and the amplifying layer 19 in the SOA region D are optically coupled to each other.

The substrate 1 may be made of n-type InP. The substrate 1 may include a thermally insulating layer 1a whose thermal conductivity is less than that of the substrate 1. The thermally insulating layer 1a may be made of, for instance, AlInAsP with a thickness around 1 μm, where AlInAsP is lattice-matched to InP. The thermal conductivity of AlInAsP is less than that of InP. The lower cladding layer 2 may be made of n-type InP, while the upper cladding layer 6 may be made of p-type InP. The lower and upper cladding layers, 2 and 6, may confine light within the waveguide layer 3a, the other waveguide layer 4, and the absorption layer 5.

When the lower cladding layer 2 is made of InP, the optical grating in the grating regions 18 may be made of quaternary compound of $Ga_{0.22}In_{0.78}As_{0.47}P_{0.53}$, or may be a stack of a layer having lower refractive index and another layer having higher refractive index with a corrugated interface therebetween. The grating region 18 may be formed by an interference exposure using two optical beams. Spaces between the gratings may be formed by the double exposure lithography, specifically, after performing the interference exposure for whole regions; portions between the gratings are exposed for light without any patterns to remove the grating pattern.

The gain region 31 may be made of semiconductor material showing an optical gain by injecting carriers therein. The gain region 31 may have the quantum well structure comprised of a plurality of $Ga_{0.32}In_{0.68}As_{0.42}P_{0.53}$ each having a thickness of 5 nm, and a plurality of $Ga_{0.22}In_{0.78}As_{0.47}PO_{0.53}$ each having a thickness of 10 nm, where they are alternately stacked to each other. The modifying region 32 may be a bulk InGaAsP with a wavelength difference in the photoluminescence greater 200 nm from the gain region 31. The gain region 31 may be made of material different from a material of the modifying region 32. In those arrangements, the modifying region 32 may optically couple with the gain region 31 by, what is called, a butt joint.

The absorption layer 5 in the OA regions C may be made of material showing a substantial absorption co-efficient for light of the tuned wavelength of the LD 100, that is, the absorption layer 5 may be made of semiconductor material whose bandgap wavelength is longer than the emission wavelength of the LD 100.

The absorption layer 5 may have the multiple quantum well (MQW) comprised of a plurality of $Ga_{0.47}In_{0.53}As$ layer with a thickness of 5 nm and a plurality of $Ga_{0.28}In_{0.72}As_{0.61}P_{0.39}$ with a thickness of 10 nm alternately stacked to each other. The absorption layer 5 may be a bulk material, for instance, a bulk $Ga_{0.46}In_{0.54}As_{0.98}P_{0.02}$. The absorption layer 5 may be made of material same with that of the gain region 31. In those arrangements, the absorption layer 5 and the gain region 31 may be formed at the same time, which may simplify the process to form the LD 100.

The contact layers, 7 and 13, may be made of p-type $Ga_{0.47}In_{0.53}As$. The insulating film 9 may be made of inorganic material, for instance, SiN, $SiO_2$, and so on. The heater 10 may be a thin film resistor made of, for instance, NiCr. The CSG-DBR region B provides a plurality of heaters 10 each included in respective segments. The SG-DFB region A also provides a plurality of heaters 10 only in the top of the modifying region 32. The gain region 31 has no heaters 10 thereon.

The electrodes, 8, 11, and 14, and the ground electrode 12 may be primarily made of, for instance, gold (Au). The anti-reflecting (AR) film 16 has the reflectivity less than 1.0% to force the surface to which the AR film 16 is coated substantially no reflection. While, the high reflection (HR) film 17 sets the reflectivity of the surface to which the HR film 17 is coated greater than 10%. The reflectivity of the AR film 16 and that of the HR film 17 correspond to the inner reflectivity, that is, how much is the light propagating within the semiconductor material reflected at the interface to the ambience.

The amplifying layer 19 may be also made of MQW structure with a plurality of well layers made of $Ga_{0.35}In_{0.65}As_{0.99}P_{0.01}$ each having a thickness of 5 nm and a plurality of barrier layers made of $Ga_{0.15}In_{0.85}As_{0.32}P_{0.68}$ each having a thickness of 10 nm, where there are alternately stacked to each other. In a modification, the amplifying layer 19 may be made of bulk material. The contact layer 20 may be made of p-type $Ga_{0.47}In_{0.53}As$. The amplifying layer 19 may be made of material same as that of the gain region 31 to simplify the manufacturing process of the LD 100.

Next, a cross sectional structure perpendicular to the optical axis of the LD 100 will be described. The SG-DFB region A in the cross section thereof has a mesa and the burying region 22. The mesa involves the lower cladding layer 2, the gain region 31 and the upper cladding layer 6; while the burying region 22, which shows high resistivity, buries the mesa in both sides thereof. As shown in FIG. 3A, the upper cladding layer 6 is covered by the contact layer 7 and the electrode 8; while, the burying region 22 is also covered by the contact layer 7 and the electrode 8 but the electrode is provided via the insulating layer 9.

On the other hand, FIG. 3B shows a cross section in the modifying region 32. The upper cladding layer 6 in the mesa is covered by the heater 10 via the insulating layer 9. Moreover, the burying region 22 in both sides of the mesa provides a groove arranged from the top of the insulating layer 9 reaching to the substrate 1. The groove 40 has a function to isolate the mesa thermally from peripheries, which enables to control a temperature of the modifying region 32 by lesser electrical power supplied to the heater 10. The groove 40 also makes an interface between the gain region 31 and the modifying region 32 in narrow, which may also reduce the heat dissipation from the modifying region 32 to the gain region 31. On the other hand, the gain region 31 has no grooves in both sides of the mesa, which may enhance the heat dissipation from the gain region 31 to the peripheries. The LD 100 of the embodiment in a practical operation thereof may be set on the thermo-electric cooler (TEC) 50.

Figure 4:
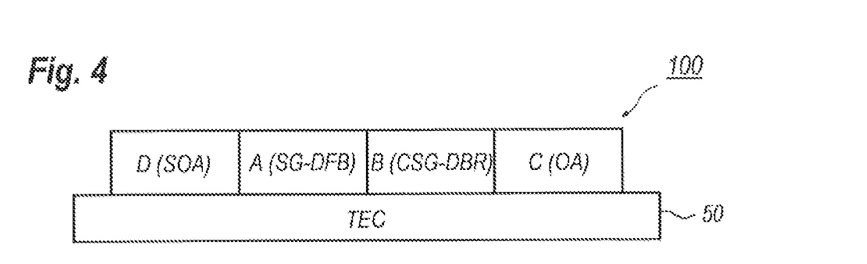
FIG. 4 schematically illustrates a semiconductor apparatus that installs the LD of the embodiment on a thermo-electric cooler (TEC)

Next, the operation of the LD 100 will be described as referring to FIG. 4. The LD 100 mounted on the TEC 50 is first supplied with a driving current and set in a preset temperature by the TEC 50, which may define the gain spectrum of the SG-DFB region A. Then, supplying heater currents from the supply electrodes 11 to the ground electrodes 12, respective heaters 10 are activated independently because the supply electrodes 11 are electrically isolated to each other. Accordingly, the heaters 10 in the SG-DFB region A and those in the CSG-DBR region B may precisely control the thermal distribution of the LD 100 to determine the refractive index thereat. Then, the gain spectrum by the SG-DFB region A, and the reflection spectrum by the CSG-DBR region B may be precisely modified to tune the emission wavelength of the LD 100. Supplying a current to the electrode 21 in the SOA region D, which induces optical gain in the amplifying region 19 to amplifier the light tuned by the SG-DFB region A and the CSG-DBR region B. Finally, thus tuned and amplified light is output through the AR film 16.

Figure 5:
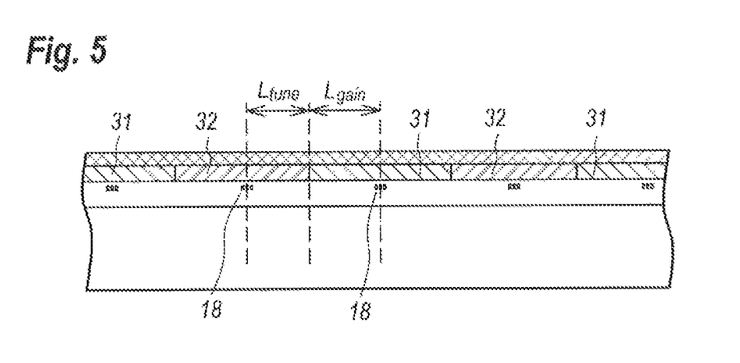
FIG. 5 describes a mechanism to tune the emission wavelength of the LD.

A mechanism to modify the refractive index in the modifying region 32 by a temperature as comparing to another mechanism to modify it by injecting carriers thereto, which is a conventional technique. The LD with the SG-DFB region may optionally tune the wavelength of the longitudinal mode in the gain spectrum thereof when the phase p of the light is shifted by n in respective segments. For instance, the tunable LD, which has a segment comprised of the modifying region with a length of $L_{tune}$ and the gain region with a length of $L_{Gain}$, refer to FIG. 5, may generate light with an optional longitudinal mode under a condition when the modifying region attributed to the smallest refractive index $n_{r1}$ ($=n_r - 0.5\Delta n_r$) and that to the largest refractive index $n_{r2}$ ($=n_r + 0.5\Delta n_r$) cause a phase difference by n. Conditions for the modifying region are given by:

$$\Delta\phi = 2\pi \cdot n_{r2} \cdot L_{tune}/\lambda - 2\pi \cdot n_{r1} \cdot L_{tune}/\lambda \qquad (1)$$

That is, when the refractive index of the modifying region is varied by $\Delta n_r (=n_{r2}-n_{r1})$ given by the following, the LD may emit light with an optional wavelength without using the TEC 50.

$$\Delta n_r = \lambda/(2 \cdot n_r \cdot L_{tune}) \qquad (2)$$

A gain medium with a plurality of segments each having the phase modifying function above described is generally called as a tunable distributed amplifier (TDA).

The simplest technique to modify the phase in the TDA is to inject carries into the modifying region 32. However, the injection of carriers into the modifying region 32 also varies the optical loss in the waveguide thereof, which becomes hard to control the gain spectrum of the SG-DFB region A and forces to narrower the wavelength tunable range of the LD.

Accordingly, it is preferable to control the change $\Delta n_r$ of the refractive index by modifying the temperature. Rewriting equation (1) above by a relation of $\Delta n_r = n_r (\Delta\lambda/\lambda)$, $$\Delta T_{tune} = (\Delta\lambda/\Delta T)^{-1} \cdot \lambda^2 / (2 \cdot n_r \cdot L_{tune}) \quad (3)$$

As shown in equation (3) above, a temperature difference $\Delta T$ to obtain the preset phase difference becomes large as the length $L_{tune}$ of the modifying region is shorter. In other words, in order to make the temperature difference small, the length $L_{tune}$ is necessary to be longer. However, a condition where the modifying region has an enough length causes am opposite condition where the gain region is inevitably shortened. The gain region whose length becomes shorter than that of the modifying region results in an extreme increase of the threshold gain. Accordingly, a total length of the modifying region is preferably comparable to or shorter than a total length of the gain region. Or, referring to the length of the SG-DFB region A, the total length of the modifying region is preferably less than 50% of the total length of the SG-DFB region A.

When the heater controls the temperature of the modifying region in the TDA, thermal resistance from the modifying region to an external of the device is preferably taken into account. One type of an assembly of the TDA, which is generally called as the face-up mount, where the substrate 1 faces a member on which the TDA is mounted, secures the heat dissipating path to the substrate 1. In this case, the heater may enhance the efficiency thereof to increase the thermal resistance to the substrate 1. While, the gain region may suppress the thermal shift of the wavelength as the thermal resistance to the substrate 1 becomes smaller. Thus, it is preferable in the TDA to increase the thermal resistance to a heat-dissipating member from the modifying region but reduce the thermal resistance thereto from the gain region. The grooves 40 provided in both sides of the mesa in the modifying region shown in FIG. 2B are one of solutions for this subject.

The LD 100 of the embodiment provides the SG structure in the SG-DFB region A. In modifying the wavelength performance of the SG region, the optical loss caused in the active layer by the carrier injection may degrade the function to tune the emission wavelength. In particular, the LD according to the embodiment accompanies with the CSG-DBR region B with the SG-DFB region A, and the reflection spectrum of the CSG-DBR B in an envelope thereof may be optional by adjusting a temperature of respective sampled gratings, then the tunable range of the LD may be widened. In such an arrangement with the CSG-DBR region, the optical loss of the waveguide in the SG-DFB region strictly influences the tunable function. Then, the SG-DFB region A with the modifying region whose optical properties are modified by the temperature thereof becomes extremely effective when the LD accompanies with the SG-DBR region B.

Figure 6:
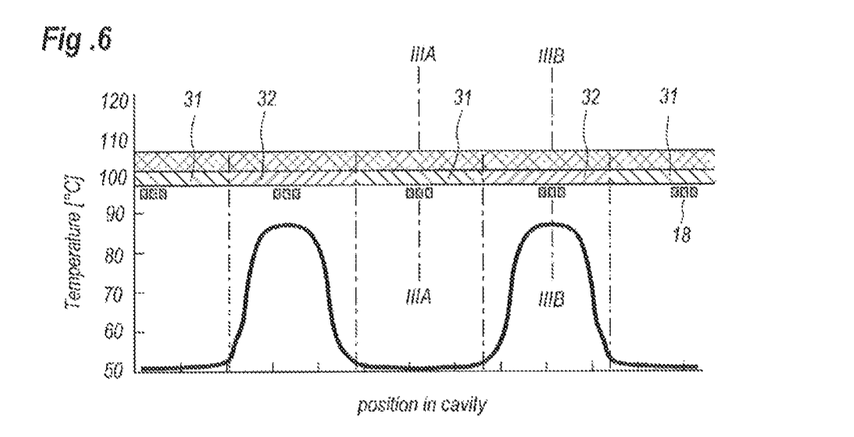
FIG. 6 shows a temperature profile observed in the gain region and the modifying region in the SG-DFB region of the LD.

The function of the LD 100 according to an embodiment of the invention will be described. FIG. 6 shows the temperature profile calculated by the three-dimensional finite element methods. The horizontal axis in FIG. 6 runs in parallel to the optical axis of the cavity, while, the vertical axis shows a temperature in the modifying region 32 and that in the gain region 31. A substantial difference in the temperature appears between the gain region 31 and the modifying region 32, but an average thereof may be kept low in the whole range of the region A. The gain region 31 in the temperature thereof may be kept low because the region 31 provides no heaters, which may suppress the influence reflected in the gain thereof.

Figure 7:
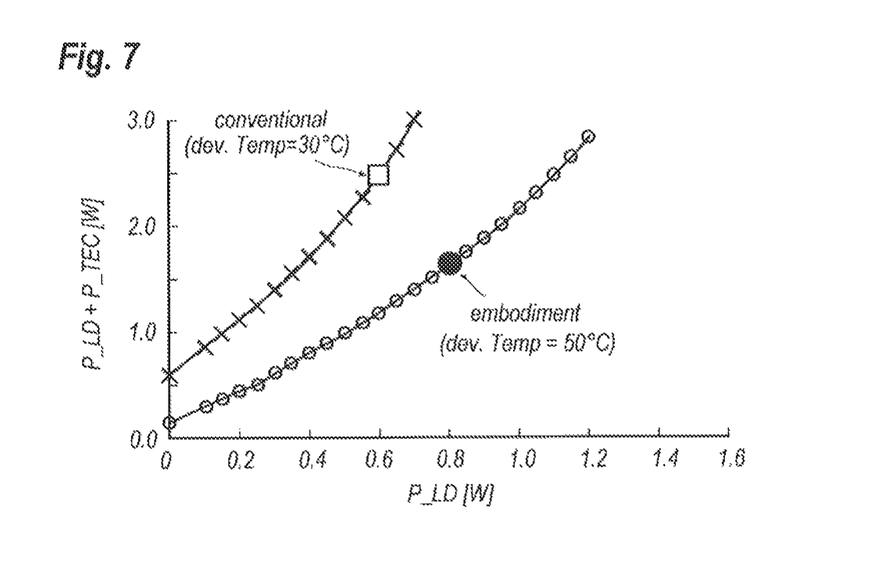
FIG. 7 compares the power consumption of an apparatus installing the LD of the embodiment and another apparatus installing a conventional LD without modifying region whose optical length is not modified by a temperature.

FIG. 7 compares the power consumption of a conventional optical module implementing no heaters in the SG-DFB region with that of the optical module of the present embodiment that implements the SG-DFB region with heaters to modify the refractive index of the modifying region. The horizontal axis in FIG. 7 corresponds to the power consumption only by the LD, while, while, the vertical axis shows the total power consumption of the module, which adds the power consumption P_TEC by the TEC 50 to that P_LD of the LD. As shown in FIG. 7, comparing two LDs, the power consumption only by the LD 100 increases by about 200 mW because of the heaters in the SG-DFB region A, but the total power consumption decreases by about 1 W because the LD 100 of the embodiment is unnecessary to keep the LD 100 in relatively lower temperature. That is, the conventional LD without any heaters in the SG-DFB region A is necessary to set the temperature of the active layer in relatively lower temperature to realize a wide tunable range of the emission wavelength.

Moreover, it was confirmed that the LD 100 with the modifying region 32 emitted coherent light from 1527 nm to 1565 nm with a range of 38 nm, that is, the LD of the embodiment had a tunable range of about 38 nm; while, another LD without modifying region by the temperature emitted coherent light only from 1537 nm to 1565 nm n narrower by 10 nm compared with the LD 100 of the embodiment. Thus, the LD 100 of the embodiment was to confirmed to have a wider tunable range of the emission wavelength.

Second Embodiment

Figure 8A:
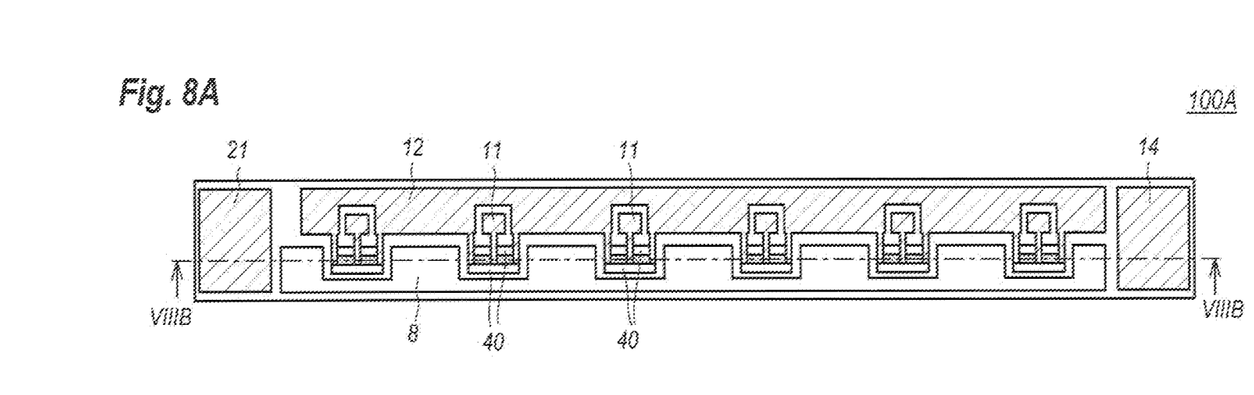
FIG. 8A is a plan view of an LD according to the second embodiment.
Figure 8B:
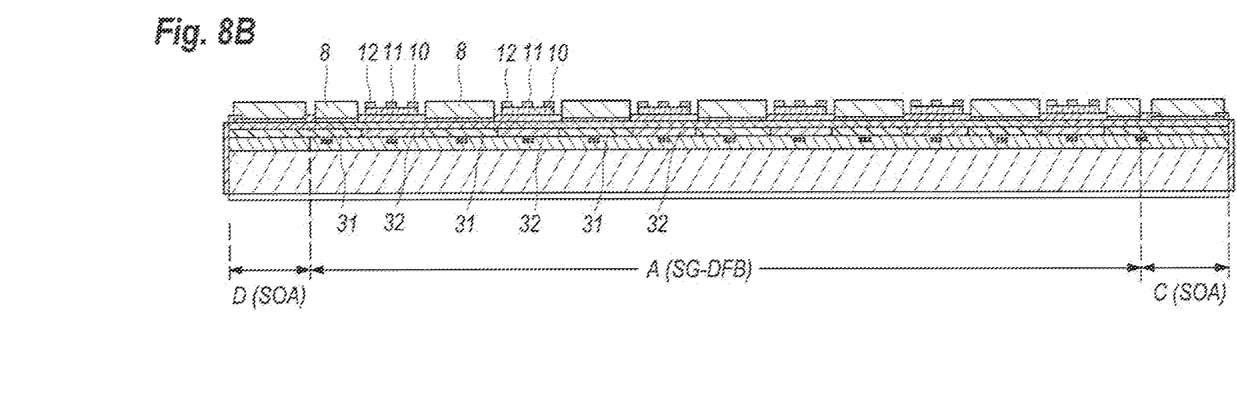
FIG. 8B is a cross section of the LD taken along the line VIIIB-VIIIB indicated in FIG. 8A.

FIG. 8A is a plan view showing an LD 100A according to the second embodiment of the invention, while, FIG. 8B is a cross section of the LD 100A taken along the ling VIIIB-VIIIB indicated in FIG. 8A. The LD 100A shown in FIG. 8 does not provide the CSG-DBR region. Instead, the SG-DFB region A includes the DBR function. Even in the arrangement shown in FIG. 8, the LD 100A may emit light at an optional wavelength by using the vernier effect. Moreover, the tunable range of the emission wavelength may be widened by adjusting the power supplied to respective heaters. The TEC to control the temperature of the LD 100A may narrower the range of the temperature to be controlled, which may reduce the power consumption of the TEC.

Third Embodiment

Figure 9A:
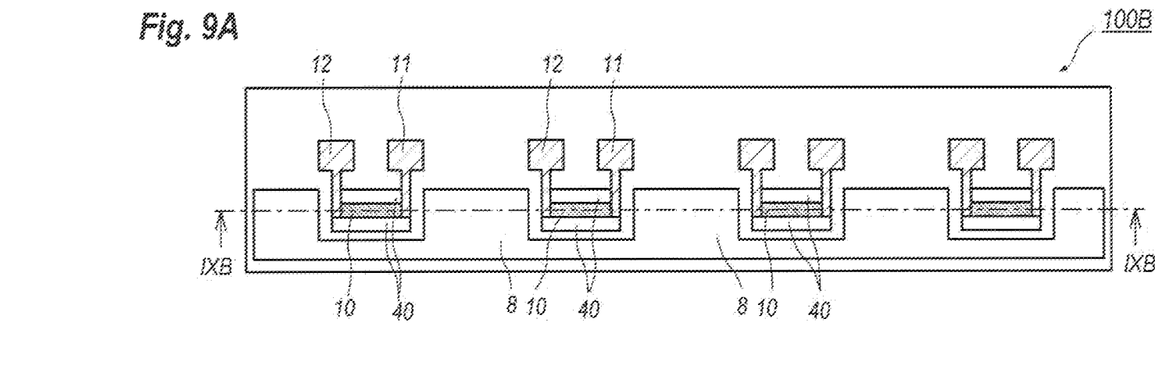
FIG. 9A is a plan view of an LD according to the third embodiment.
Figure 9B:
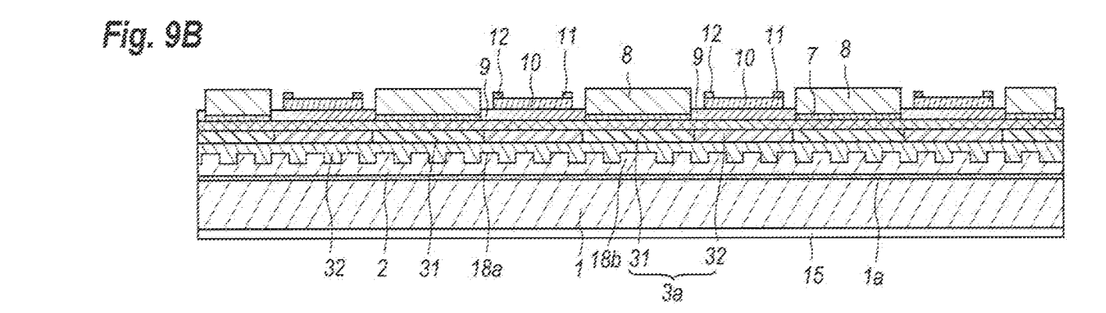
FIG. 9B is a cross section of the LD taken along the line IXB-IXB indicated in FIG. 9A.

FIG. 9A is a plan view of an LD 100B with the TDA-DFB arrangement according to the third embodiment of the invention, while, FIG. 9B is a cross section thereof taken along the line IXB-IXB indicated in FIG. 9A. As shown in FIGS. 9A and 9B, the LD 100B does not provide the DBR region but the gratings are distributed in whole of the TDA region. Specifically, the LD 100B provides a plurality of gain region 31 and a plurality of modifying region 32 alternately arranged along the optical axis thereof. The gratings 18a are uniformly formed in both the gain regions and the modifying regions 32. The gratings 18a may be formed by burying a material in the lower cladding layer 2, where the material has the refractive index thereof different from that of the lower cladding layer 2, or by corrugating the interface between the lower cladding layer 2 and the substrate 1. The grating 18a is necessary to have a portion to shift the phase thereof by $\pi$, which is generally called as the $\pi$-shift region. The LD 100B in the embodiment shown in FIG. 9B provides the $\pi$-shift region 18b in a center of the device, where the summit or the valley of the grating is formed longer by a half pitch. In the present embodiment shown in FIG. 9B, the summit is longer by a half pitch compared with others.

As shown in FIGS. 9A and 9B, the modifying region 32 of the present embodiment provides grooves 40 in both sides of the waveguide. FIG. 9B shows the grooves in both sides of the heater 10. The supply electrode 11 and the ground electrode 40 are connected to respective ends of the heater 10 as crossing over the groove 40 by the air-bridge.

While several embodiments and variations of the present invention are described in detail herein, it should be apparent that the disclosure and teachings of the present invention will suggest many alternative designs to those skilled in the art. For instance, the embodiments described above have an arrangement that the heater 10 formed on the modifying region 32 has a length substantially equal to a length of the modifying region 32. However, the length of the heater may be optional. The length of the groove 40 may be also optional, for instance, it may be shorter than the length of the modifying region 32. In those arrangement, the gain region may be further isolated thermally from the heater 10, and makes the gain spectrum further stable.

The groove 40 may be longer than the length of the modifying region 32. Those arrangements may suppress the heat is dissipation or conduction from the heater to the periphery, the power consumption by the heater 10 may be further reduced. Therefore, it is intended that the present invention not be limited to the particular embodiments disclosed, but that the invention include all embodiments falling within the scope of the appended claims.

I claim:

1. A wavelength tunable laser diode (LD), comprising:
an optical waveguide including a plurality of gain regions and a plurality of modifying regions alternately arranged to each other along an optical axis of the optical waveguide, the optical waveguide showing a wavelength spectrum with a plurality of gain peaks, each of the modifying regions provide a heater to shift the gain peaks; and
a reflector optically coupled with the optical waveguide, the reflector showing a wavelength spectrum with a plurality of reflection peaks;
wherein the LD emit light with a wavelength at which one of the gain peaks attributed to the optical waveguide and one of the reflection peaks attributed to the reflector coincides.

2. The wavelength tunable LD of claim 1,
wherein the modifying regions have thermal resistance to an ambient of the LD higher than thermal resistance from gain region to the ambient.

3. The wavelength tunable LD of claim 1,
wherein the modifying regions include a mesa to propagate light therein, the mesa accompanying with grooves in both sides thereof.

4. The wavelength tunable LD of claim 3,
wherein at least one of the grooves formed in the modifying region has a length along the optical axis shorter than a length of the modifying region.

5. The wavelength tunable LD of claim 3,
wherein at least one of the groves formed in the modifying region has a length along the optical axis longer than a length of the modifying region.

6. The wavelength tunable LD of claim 3,
wherein the heater formed in the modifying region has a length along the optical axis shorter than a length of the modifying region.

7. The wavelength tunable LD of claim 1,
wherein the optical waveguide and the reflector are formed on a semiconductor substrate that provides a layer with thermal conductivity less than the thermal conductivity of the semiconductor substrate.

8. The wavelength tunable LD of claim 1,
wherein each of the gain regions provides a grating region and each of the modifying regions provide a grating region, two grating regions neighbor to each other constituting a space region extending from the gain region to the modifying region neighbor to the gain region constituting a segment,
wherein the optical waveguide includes a plurality of segments.

9. The wavelength tunable LD of claim 8,
wherein the optical waveguide and the reflector constitute a sampled-grating distributed feedback (SG-DFB) region.

10. The wavelength tunable LD of claim 8,
wherein the modifying region in the segment has a length shorter than a length of the gain region in the segment.

11. The wavelength tunable LD of claim 8,
wherein the modifying regions in respective segments have a total length shorter than a total length of the gain regions in respective segments.

12. The wavelength tunable LD of claim 1,
further including another reflector optically coupled with the reflector,
wherein the another reflector includes a plurality of grating regions and a space regions alternately arranged along the optical axis, one of grating regions and one of space region neighbor to each other constituting a segment,
wherein the another reflector includes at least two types of segments whose optical length is different from others.

13. The wavelength tunable laser diode (LD), comprising:
a sampled-grating distributed feedback (SG-DFB) region; and
a chirped-sampled-grating distributed Bragg reflector (CSG-DBR) region;
wherein the SG-DFB region and the CSG-DBR region commonly provides a semiconductor substrate, a lower cladding layer disposed on the semiconductor substrate, and an upper cladding layer,
wherein the SG-DFB region provides, on the lower cladding layer and beneath the upper cladding layer, a plurality of gain regions and modifying regions alternately arranged along an optical axis of the LD to constitute an optical waveguide, each of the modifying region providing a heater to modify an optical length of the modifying region,
wherein the CSG-DBR region provides an optical waveguide put between the lower cladding layer and the upper cladding layer, and a plurality of grating regions, the optical waveguide being optically coupled with the optical waveguide in the SG-DBR region, the grating region and a space region formed between the grating regions neighbor to each other constituting a segment, the space region providing a heater to modify an optical length of the segment,
wherein the SG-DFB region shows a plurality of gain peaks whose wavelength is adjusted by the heater provided in the modifying region, and the CSG-DBR region shows a plurality of reflection peaks whose wavelength is adjusted by the heater in the space region,
wherein the LD emit light at a wavelength where one of gain peaks and one of reflection peaks coincide.

14. The wavelength tunable LD of claim 13,
wherein the modifying regions has grooves in both sides of the heater.

15. The wavelength tunable LD of claim 13,
wherein the modifying region has a length shorter than a length of the gain region adjacent to the modifying region.
16. The wavelength tunable LD of claim 13,
wherein the modifying regions has a total length shorter than a total length of the gain regions.
17. The wavelength tunable LD of claim 13,
wherein the semiconductor substrate includes a semiconductor layer common to the SG-DFB region and the CSG-DBR region, the semiconductor layer having thermal conductivity less than the thermal conductivity of the semiconductor substrate.
18. The wavelength tunable LD of claim 13,
wherein the gain regions and the modifying regions are made of respective semiconductor materials different from others,
wherein the gain region is optically coupled with the modifying region by the butt joint.
19. The wavelength tunable LD of claim 13,
wherein the CSG-DBR region includes at least two type of segments whose optical length are different from others.

* * * * *